(12) United States Patent
Kita et al.

(10) Patent No.: US 8,338,758 B2
(45) Date of Patent: Dec. 25, 2012

(54) HEATER POWER CONTROL CIRCUIT AND BURN-IN APPARATUS USING THE SAME

(75) Inventors: Kazumi Kita, Tokyo (JP); Tadahiro Kurasawa, Tokyo (JP); Yasuo Muramatsu, legal representative, Foothill Ranch, CA (US)

(73) Assignee: Advantest Corp., Tokyo (JP)

( * ) Notice: Subject to any disclaimer, the term of this patent is extended or adjusted under 35 U.S.C. 154(b) by 1263 days.

(21) Appl. No.: 11/628,614

(22) PCT Filed: Jun. 7, 2005

(86) PCT No.: PCT/JP2005/010426
§ 371 (c)(1),
(2), (4) Date: Apr. 28, 2008

(87) PCT Pub. No.: WO2005/122641
PCT Pub. Date: Dec. 22, 2005

(65) Prior Publication Data
US 2011/0120985 A1    May 26, 2011

(30) Foreign Application Priority Data
Jun. 7, 2004    (JP) .................................. 2004-168815

(51) Int. Cl.
*H05B 1/02* (2006.01)

(52) U.S. Cl. .................. 219/490; 219/488; 219/492

(58) Field of Classification Search .................. 219/490, 219/491, 492, 493, 494, 497, 501
See application file for complete search history.

(56) References Cited

U.S. PATENT DOCUMENTS
4,634,903 A * 1/1987 Montorfano .................. 327/432

FOREIGN PATENT DOCUMENTS
| EP | 0 153 423 A1 | 9/1985 |
| EP | 0 837 355 A1 | 4/1998 |
| EP | 1 296 200 A2 | 3/2003 |
| JP | 04-337272 | 11/1992 |
| JP | 7-73242 | 8/1995 |
| JP | 2000-206176 | 7/2000 |
| JP | 2000-304804 | 11/2000 |

* cited by examiner

Primary Examiner — Henry Yuen
Assistant Examiner — John Wasaff
(74) Attorney, Agent, or Firm — Muramatsu & Associates

(57) ABSTRACT

Provided is a heater power control circuit which switches on/off a voltage signal supplied from a direct-current power source to control a power of a heater by controlling a voltage applied to the heater. The heater power control circuit includes a voltage smoothing circuit that is disposed between the heater and a switching circuit which switches on/off a voltage supplied from the direct-current power source. The voltage smoothing circuit converts the voltage into an analog voltage signal by smoothing a voltage signal obtained by switching on/off the voltage.

8 Claims, 4 Drawing Sheets

HEATER POWER CONTROL CIRCUIT AND BURN-IN APPARATUS USING THE SAME

FIELD OF THE INVENTION

The present invention relates to a heater power control circuit and a burn-in apparatus using the circuit that suppress noise generation due to a heater and improve power saving.

BACKGROUND ART OF THE INVENTION

In recent years, semiconductor devices become increasingly high-speed, high-capacity, and capable of processing larger bits data. At the same time, the semiconductor devices become more diversified. Burn-in test, which is an accelerated test depending on temperature conditions, is performed on the semiconductor device. The burn-in test is characterized by heating up a device under test (DUT) such as a semiconductor device through the application of electric currents to determine the reliability and the like of the DUT. For example, the test detects a local heat due to high resistance in a defective metal junction of a large scale integration (LSI) chip.

As an example of such a conventional technology, Japanese Patent Application Laid-Open No. 2000-206176 shows a burn-in test apparatus including a heater for testing semiconductor devices.

A conventional burn-in apparatus, which uses the heater, however, is unable to simultaneously test a plurality of DUTs that consume significantly different amount of power because it adjusts ambient temperature around the DUT by the heater.

It may be possible to adjust the temperature of each DUT by bringing the heater into contact with each DUT. Such temperature adjustment, however, requires a switching control with a power field effect transistor (FET) to follow changes in temperature. The switching control produces noises; the noise is transmitted to the DUT and thus makes it difficult to accurately perform the burn-in test.

In view of the foregoing, an object of the present invention is to provide a heater power control circuit and a burn-in apparatus using the circuit that reduce the noises transmitted from the heater when the burn-in test is performed by adjusting the temperature using the heater.

SUMMARY OF THE INVENTION

A heater power control circuit according to one aspect of the present invention switches on/off a voltage signal supplied from a direct-current power source to control a power of a heater by controlling a voltage applied to the heater. The heater power control circuit includes a voltage smoothing circuit that is disposed between the heater and a switching circuit which switches on/off a voltage supplied from the direct-current power source. The voltage smoothing circuit converts the voltage into an analog voltage signal by smoothing a voltage signal obtained by switching on/off the voltage.

The heater power control circuit may include a heater control circuit that controls switching of the switching circuit according to a predetermined voltage indicator signal; and a voltage comparator circuit that compares a value of the voltage indicator signal with a value of the analog voltage signal. In the heater power control circuit, the heater control circuit controls the power of the heater by controlling switching of the switching circuit based on a comparison result by the voltage comparator circuit.

In the heater power control circuit, the heater control circuit may convert the voltage indicator signal into a time-dispersed voltage indicator signal which is obtained in a time-dispersed manner so that a variation of the voltage indicator signal per predetermined time is within a predetermined amount, and supplies the time-dispersed voltage indicator signal to the switching circuit.

In the heater power control circuit, the heater control circuit may include a table that stores a relationship between the voltage indicator signal and a series of time-dispersed voltage indicator signals corresponding to a variation of the voltage indicator signal, and the heater control circuit generates the time-dispersed voltage indicator signal by retrieving the table.

In the heater power control circuit, the heater control circuit may generate the time-dispersed voltage indicator signal based on a relational expression indicating a relationship between the voltage indicator signal and a series of time-dispersed voltage indicator signals corresponding to a variation of the voltage indicator signal.

In the heater power control circuit, the heater control circuit may generate the time-dispersed voltage indicator signal including pulses having a same pulse width and different time intervals.

In the heater power control circuit, the heater control circuit may use a pulse width modulation signal as the time-dispersed voltage indicator signal.

In the heater power control circuit, the switching circuit may include a current restricting circuit.

A burn-in apparatus according to another aspect of the present invention includes the heater power control circuit according to the present invention to perform a burn-in test on a device under test.

The heater power control circuit and the burn-in apparatus using the circuit include a voltage smoothing circuit that is disposed between a heater and a switching circuit which switches on/off a voltage signal supplied from a direct-current power source. The voltage smoothing circuit converts a voltage signal supplied from a direct-current source into an analog voltage signal by smoothing the voltage signal, to switch on/off the voltage signal supplied from the direct-current power source and thus to control power of the heater by controlling a voltage applied to the heater. Accordingly, the heater power control circuit and the burn-in apparatus using the circuit can prevent the noises produced by the switching circuit from being transmitted to the heater, thereby suppressing transmission of noises to the heater or the surrounding components.

In the heater power control circuit and the burn-in apparatus using the circuit, the voltage indicator signal is supplied to the switching circuit as the time-dispersed voltage indicator signal which is obtained in a time-dispersed manner so that a variation of the voltage indicator signal is within a predetermined amount. Accordingly, it is possible to reduce power loss caused by an imperfect switching of the switching circuit due to the electric current restriction which is caused by a sudden current increase generated in the voltage smoothing circuit.

EXPLANATIONS OF LETTERS OR NUMERALS

Figure 1:
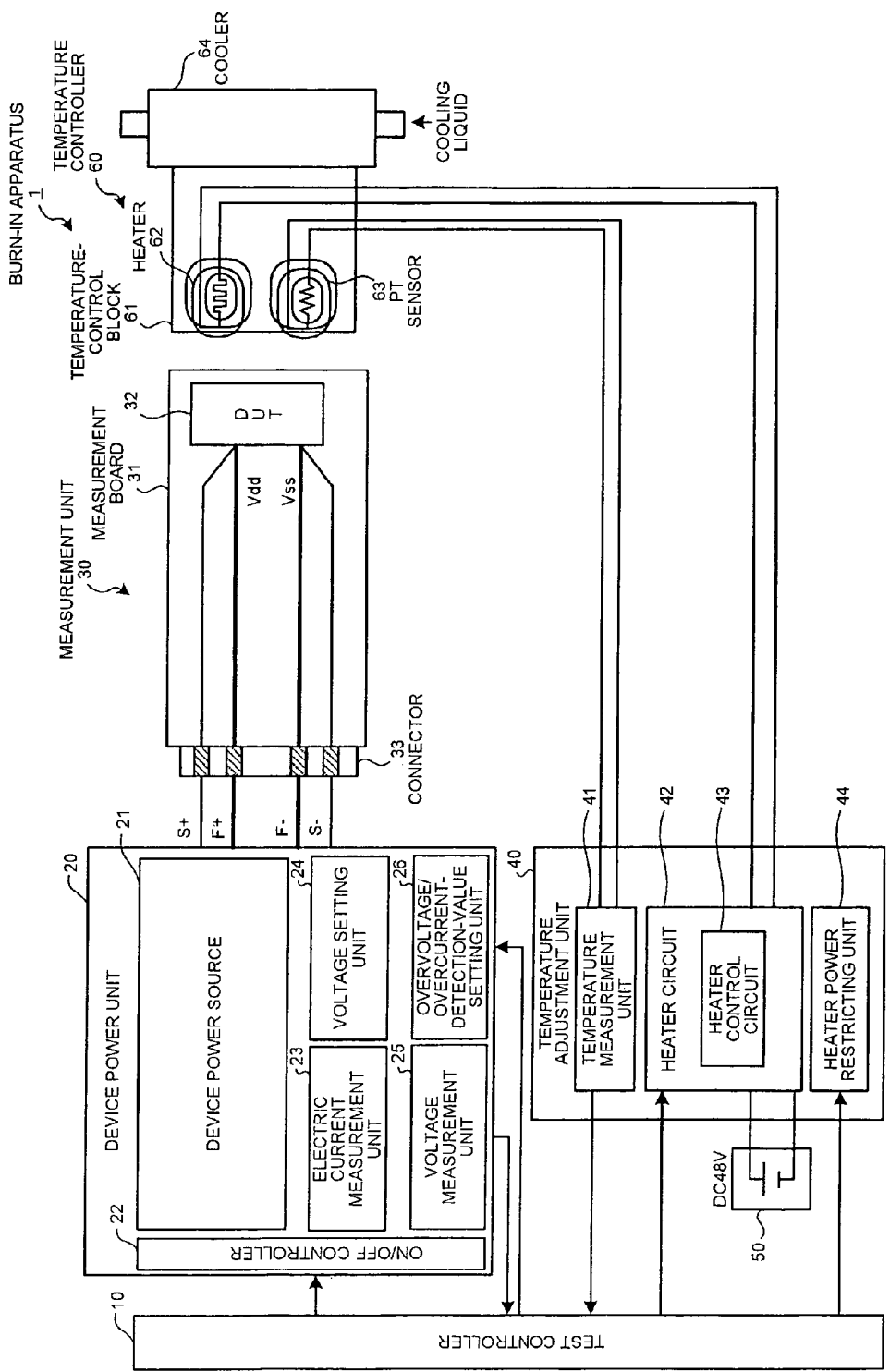
FIG. 1 is a block diagram of a schematic overall structure of a burn-in apparatus according to an embodiment of the present invention.

1 Burn-in apparatus
10 Test controller
20 Device power unit
21 Device power source
22 ON/OFF controller
23 Electric current measurement unit
24 Voltage setting unit
25 Voltage measurement unit
26 Overvoltage/Overcurrent-detection-value setting unit
30 Measurement unit
31 Measurement board
32 DUT
33 Connector
40 Temperature adjustment unit
41 Temperature measurement unit
42 Heater circuit
43 Heater control circuit
43a Table
44 Heater power restricting unit
50 Power source
60 Temperature controller
61 Temperature control block
62 Heater
63 PT sensor
64 Cooler
71 Transistor
72 FET
73 Voltage smoothing circuit
74 Comparator
75 DA converter
D1 Zener diode
D2 Diode
R1, R2 Resistor
L Inductor
C Capacitor

BEST MODE(S) FOR CARRYING OUT THE INVENTION

A heater power control circuit and a burn-in apparatus using the circuit will be described below as an exemplary embodiment of the present invention. It should be noted that the present invention is not limited to the embodiment.

Embodiment

FIG. 1 is a block diagram of an overall schematic structure of the burn-in apparatus according to the embodiment of the present invention. In FIG. 1, a burn-in apparatus 1 mainly includes a test controller 10 which controls an overall burn-in test; a device power unit 20 which is connected to the test controller 10, supplies power source voltage to a DUT (device under test) 32, and measures the power source voltage; a temperature adjustment unit 40 which is connected to the test controller 10 and adjusts temperature in the burn-in test; a measurement unit 30 which is connected to the device power unit 20 and in which the DUT 32 is arranged; a power source 50 which is connected to the temperature adjustment unit 40; and a temperature controller 60 which controls temperature under the control of the temperature adjustment unit 40.

The measurement unit 30 includes a measurement board 31 and the DUT 32. The DUT 32 is mounted on the measurement board 31. The DUT 32 is connected to the device power unit 20 via wiring on the measurement board 31 and a connector 33. The device power unit 20 includes a device power source 21 and an ON/OFF controller 22. The ON/OFF controller 22 causes to apply power source voltages Vdd, Vss from the device power source 21 to the DUT 32 under the control of the test controller 10. The device power unit 20 further includes an electric current measurement unit 23, a voltage setting unit 24, a voltage measurement unit 25, and an overvoltage/overcurrent-detection-value setting unit 26. The test controller 10. determines the state of the DUT 32 in an accelerated test based on measured values obtained by the electric current measurement unit 23 and the voltage measurement unit 25. Levels of the power source voltages Vdd, Vss, and the like can be set in a variable manner by the test controller 10. The set value is stored in the voltage setting unit 24. The overvoltage/overcurrent-detection-value setting unit 26 stores a threshold for determination of an overvoltage state or an overcurrent state based on the results of measurement by the electric current measurement unit 23 and the voltage measurement unit 25. When the measured value exceeds the threshold, the ON/OFF controller 22 determines that the DUT 32 is in the overvoltage state or the overcurrent state, and decreases or blocks an output of the power source voltage from the device power source 21. The threshold is set by the test controller 10 in a variable manner.

The temperature controller 60 includes a temperature control block 61 in which a heater 62, a PT sensor (Platinum resistor sensor) 63, and a cooler 64 are arranged. The PT sensor 63 supplies an output value to the temperature adjustment unit 40. The heater 62 is controlled by the temperature adjustment unit 40 to receive power at temperature rise. A cooling liquid passes through the cooler 64 to cool down surroundings of the DUT 32. To adjust the temperature of the DUT 32, the heater 62 and the PT sensor 63 are brought into contact with the DUT 32, so that the temperature adjustment is carried out directly. When the temperature of the DUT 32 is not adjusted, the heater 62 and the PT sensor 63 are physically separated from the DUT 32 and touch only the temperature control block 61. Thus, the PT sensor 63 can detect the temperature of the heater 62 or the cooling liquid.

The temperature adjustment unit 40 includes a temperature measurement unit 41 which measures temperature of surroundings of the PT sensor 63 based on the output value of the PT sensor 63; a heater circuit 42 which supplies power from the power source 50 to the heater 62; and a heater power restricting unit 44 which independently controls heater power according to the power consumption of the DUT 32.

In the burn-in apparatus 1, under the overall control by the test controller 10, the power source voltage is applied from the device power unit 20 to the DUT 32, the temperature adjustment unit 40 supplies the power to induce heat from the heater 62, and the heater 62 is brought into contact with the DUT 32. Thus, the temperature of the DUT 32 in the burn-in test is adjusted. The test controller 10 acquires a result of the burn-in test via the device power unit 20, and performs temperature adjustment through the temperature adjustment unit 40.

Figure 2:
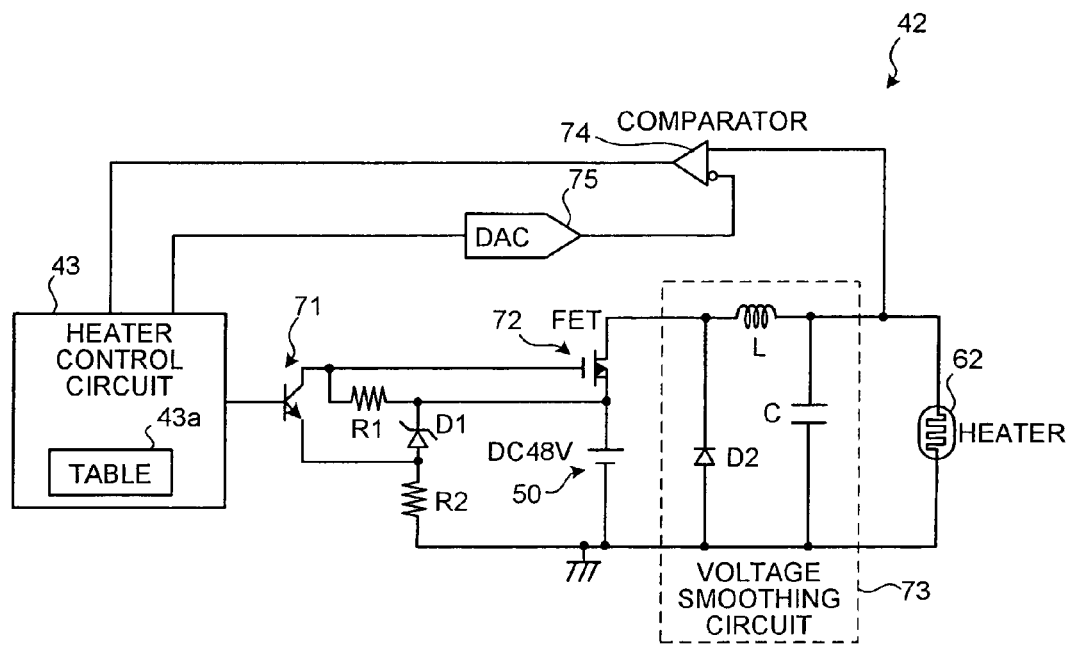
FIG. 2 is a circuit diagram of a detailed structure of a heater circuit shown in FIG. 1.

The heater circuit 42 will now be described in detail. FIG. 2 is a circuit diagram of a detailed structure of the heater circuit and also shows the power source 50 and the heater 62.

In FIG. 2, a field effect transistor (FET) 72 which is a p-channel power FET is connected to the power source 50 of 48 VDC, and 48 VDC-pulse voltage is applied to the heater 62 according to the switching of the FET 72. A transistor 71 is connected between a gate of the FET 72 and the ground with a resistor R2 connected between the transistor 71 and the ground. The transistor 71 is switched according to time-dispersed voltage indicator signals, such as pulse width modulation (PWM) signals, supplied from the heater control circuit 43, and the FET 72 is switched accordingly. Further, a zener diode D1, which maintains a constant voltage, is provided. The anode of the zener diode D1 is connected between an emitter of the transistor 71 and the resistor R2, whereas the cathode is connected between a collector of the transistor 71 and the gate of the FET 72 with a resistor R1 connected between the cathode of the zener diode D1 and the collector of the transistor 71. The cathode is also directly connected to a source of the FET 72. When the transistor 71 is turned OFF, the 48 VDC of the power source 50 is applied to the gate, and thus the FET 72 is turned OFF. When the transistor 71 is turned ON, a level of the voltage applied to the gate decreases according to an amount of voltage drop on the zener diode D1, and thus the FET 72 is turned ON.

Between a switching circuit including the FET 72 mentioned above and the heater 62, a voltage smoothing circuit 73 is arranged. The voltage smoothing circuit 73 includes a parallel-connected diode D2 and a capacitor C, and a series-connected inductor L. The 48VDC-pulse voltage supplied from the switching circuit is smoothed and converted into an analog voltage by the voltage smoothing circuit 73. The heater 62 generates power (heat) depending on the amplitude of the analog voltage.

A comparator 74 compares the value of the analog voltage applied to the heater 62 and a value of a voltage indicator signal supplied from the heater control circuit 43, and supplies a result of comparison to the heater control circuit 43. Since the voltage indicator signal is digital data, it is supplied to the comparator 74 after being converted into an analog signal by a DA converter 75. The heater control circuit 43 controls the time-dispersed voltage indicator signal based on the result of comparison so as to make the result of comparison zero. The voltage indicator signal is a signal indicating a target voltage level, whereas the time-dispersed voltage indicator signal is a voltage indicator signal which is obtained in a time-dispersed manner so that a variation of the analog voltage to the target voltage level is within a predetermined amount. Both of the signals are directly supplied to the switching circuit. In the example noted above, the DA converter 75 converts the voltage indicator signal into the analog signal. An AD converter, however, may replace the DA converter 75 to convert an analog voltage signal into digital data, and the comparator 74 may then process the digital data for comparison.

In the above mentioned heater circuit 42, the pulse voltage generated by the switching circuit produces noises to voltage signals. In the embodiment, however, the voltage smoothing circuit 73 is arranged between the switching circuit and the heater 62 so as to convert the pulse voltage into a smoothed analog voltage, whereby the noise transfer to the heater 62 is suppressed. Particularly in the burn-in test, the heater and the DUT 32 are brought into contact with each other. If the noise is transferred to the DUT 32, highly accurate testing cannot be performed on the DUT 32. In the embodiment, the heater 62 generates only a small amount of noises, and hence, the burn-in test can be performed at high accuracy.

Figure 3:
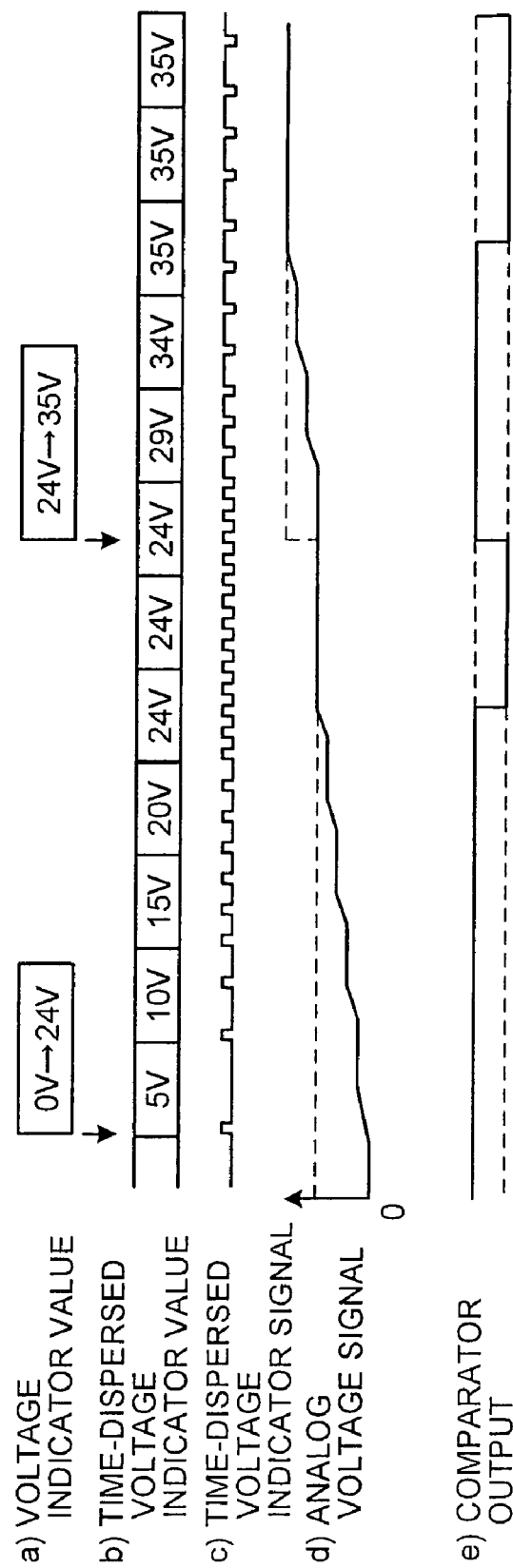
FIG. 3 is a timing chart of generation of time-dispersed voltage indicator signals by a heater control circuit and control of the heater based on the time-dispersed voltage indicator signals.

Further, as shown in FIG. 3, the heater control circuit 43 generates the time-dispersed voltage indicator signals for the switching of the FET 72, thereby preventing an overcurrent caused by a sudden voltage change. The heater control circuit 43 also reduces power loss at the FET 72 caused by an imperfect switching of the FET 72 at the restriction of the electric currents by the zener diode D1.

As shown in FIG. 3, at an outset of the test or during the test, the test controller 10 outputs a voltage indicator value, which is a target voltage level as shown in FIG. 3(a), to the heater control circuit 43 based on the temperature notified from the temperature measurement unit 41. The heater control circuit 43 generates time-dispersed voltage indicator values as shown in FIG. 3(b) based on the voltage indicator value, and generates time-dispersed voltage indicator signals as shown in FIG. 3(c) corresponding to the time-dispersed voltage indicator values. The heater control circuit 43 applies the time-dispersed voltage indicator signals to the transistor 71, and as a result, causes the switching of the FET 72.

When the voltage indicator value is "0V→24V," as shown in FIG. 3(a), the heater control circuit 43 generates the time-dispersed voltage indicator values so that the increase/decrease in voltage per unit time is not more than 5 V, and generates the time-dispersed voltage indicator signals as the pulse signals based thereon. A series of time-dispersed voltage indicator values corresponding to the voltage indicator value may be stored in a table 43a in advance, and a time-dispersed voltage indicator value corresponding to a given voltage indicator value may be retrieved for the generation of the time-dispersed voltage indicator signals. The time-dispersed voltage indicator signals may be set in any manner as far as the increase/decrease in the voltage per unit time is not more than a predetermined value. For example, a former part of the time-dispersed voltage indicator signals may be set to a low voltage value, and the voltage level may be gradually increased within the limit of the predetermined value. In other words, the voltage level may be changed from a current level to a target level in any manner as far as each changed value is not more than a predetermined value. The voltage level may be changed in a manner of a function or a program.

When the time-dispersed voltage indicator signals are applied to the FET 72, the voltage smoothing circuit 73 converts the time-dispersed voltage signals into smoothed analog voltage signals as shown in FIG. 3(d). Then, the heater 62 generates the power corresponding to the analog voltage signal.

The comparator 74 compares the analog voltage signals and the voltage indicator value, and supplies the result to the heater control circuit 43. The heater control circuit 43, as shown in FIG. 3(e), generates the time-dispersed voltage indicator signals to increase the voltage level when the comparator output is at a high level. On the other hand, the heater control circuit 43 controls the voltage level to maintain the current level when the comparator output is at a low level as shown in FIG. 3(e).

In the above description, the time-dispersed voltage indicator signals are generated in such a manner that the number of pulses with the identical pulse width per unit time increases/decreases. Alternatively, the PWM signals, whose pulse width changes every unit time, can be employed as the time-dispersed voltage indicator signals. It is preferable in terms of time dispersion that the employed signals be configured so that the number of pulses with the identical pulse width per unit time increases/decreases, to avoid sudden rise in the voltage level.

In the embodiment, since the above described time-dispersed voltage indicator signals are applied to the FET 72, the voltage level does not rise suddenly, and as a result, there is no sudden accumulation of electric currents in the capacitor C.

Thus, the function of electric current restriction does not negatively affect the FET 72 and would not cause imperfect switching of the FET 72. Therefore, power loss at the imperfect switching can be eliminated. As a result, unnecessary power consumption other than the power consumption for the heater 62 can be eliminated to a maximum possible extent, and a power-saving burn-in apparatus can be realized.

Figure 4:
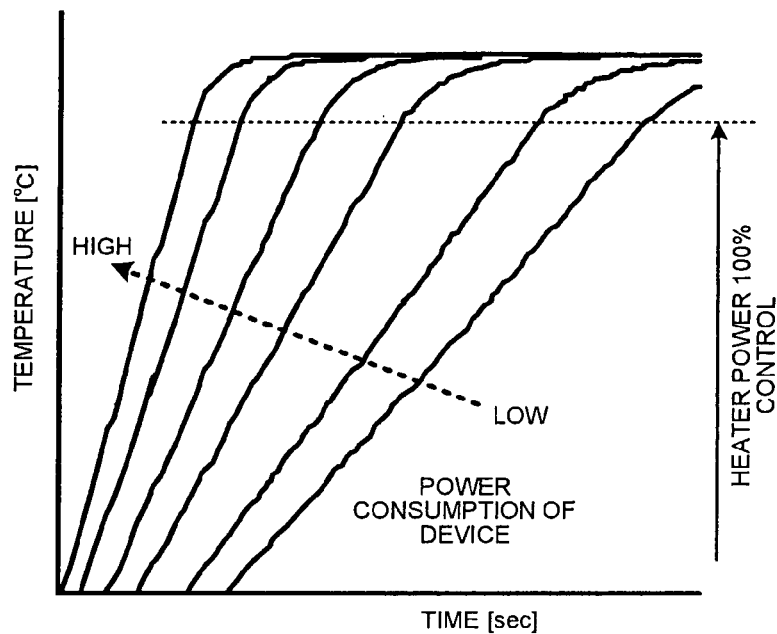
FIG. 4 is a graph of temperature rising characteristics of various DUTs that consume different amounts of power.

In the accelerated test with the burn-in apparatus 1, a temperature applied to the DUT 32 is. controlled. When the same power source voltage is applied to different DUTs 32, some DUT consume higher power than other DUT. When the heater 62 power is supplied 100% at the start of the testing as shown in FIG. 4 regardless of difference in power consumption of each DUT 32, the temperature of each DUT 32 exhibits different temporal changes depending on the amount of power consumption of the DUT 32. When the device consumes high power, the temperature of the device swiftly reaches a target level, whereas when the device consumes low power, the temperature of the device slowly reaches the target level.

When various types of DUTs 32 are tested simultaneously, the end of the test is determined with reference to the device which slowly reaches the target temperature. FIG. 4 shows examples of characters involving target temperature vs. time depending on the types of DUTs, i.e., temperature rising characteristics of various DUTs that consume different amounts of power. In addition to such different characteristics of DUTs 32 noted above, power consumption of the burn-in apparatus 1 as a whole needs to be considered.

Thus, in view of such needs, in the embodiment, the power consumption of the heater 62 is controlled so that the sum of the power consumption of the DUT 32 and the power consumption of the heater 62 is constant. The heater power restricting unit 44 controls the power consumption therefor.

Figure 5:
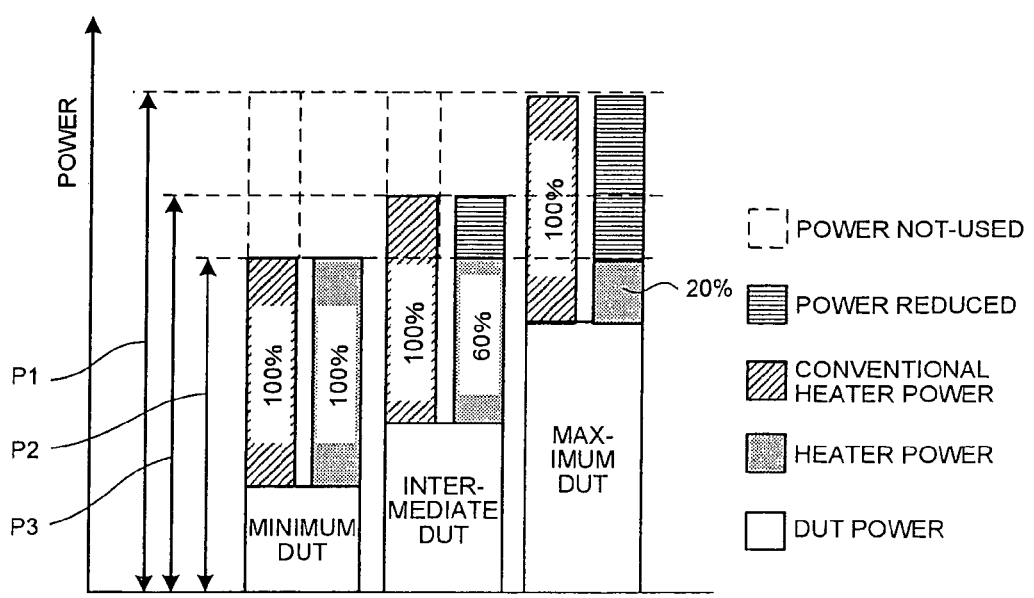
FIG. 5 is a comparative diagram of total power when heater-power restriction control is performed by a heater power restricting unit and when conventional heater power control is performed.

FIG. 5 shows a comparison between the heater power control in the embodiment and the heater power control in a conventional system. In FIG. 5, the heater power restricting unit 44 controls the power consumption so that the heater 62 consumes maximum power when the DUT is a device with a minimum power consumption. The power consumption of the heater 62 for the DUT which consumes more power than the DUT with the minimum power consumption is controlled to be a maximum power consumption within limit that the sum of power consumption of the device and the heater does not exceed a total power P2, i.e., the sum of the power consumption of the DUT with the minimum power. consumption and the maximum power consumption of the heater 62.

The heater power restricting unit 44 finds a relation between the power consumption of the DUT 32 and a relative maximum power consumption of the heater 62 in advance, and controls the maximum power consumption of the heater 62 corresponding to each DUT. When the amount of power consumption by the DUT 32 is not known, the consumed power is measured via the device power unit 20. Based on the result of measurement, the heater power restricting unit 44 may determine the limit of power consumption by the heater 62 corresponding to the power consumption of each DUT.

Thus, regardless of the difference in the power consumption of each DUT, the total power, i.e., the sum of the power consumption by the DUT and the power consumption by the heater 62 is maintained at a constant level of the total power P2. Then, the rising of temperature of each DUT becomes substantially the same as that of the DUT with the minimum power consumption.

In the conventional burn-in apparatus, the heater is required to have a capacity of consumption equal to total power P1, i.e., the sum of the maximum power consumption of the DUT and the maximum power consumption of the heater. In the embodiment, the heater is required only to have a capacity equal to the total power P2 of the burn-in apparatus 1. Thus, the size and weight of the burn-in apparatus 1 can be further reduced, and at the same time, power saving can be realized.

In the above embodiment, the total power is controlled to be the total power P2 regardless of the difference in the power consumption of each DUT. Alternatively, however, the total power may be controlled so as to be total power P3, i.e., a sum of an intermediate level of power consumption by the DUT and the 100% power consumption of the heater 62. In this case, the reduction in size and weight, and the power saving can be further facilitate in comparison with the conventional burn-in apparatus.

The above described burn-in apparatus includes the heater for each DUT and directly adjusts the temperature. The heater 62 and the PT sensor 63 of the temperature controller 60 are in contact with the DUT 32 during the burn-in test, and not in contact with the DUT 32 when the burn-in test is not conducted.

Hence, while the heater 62 and the PT sensor 63 are not in contact with the DUT, following testing can be performed. Firstly, in the state as described above, the temperature control block 61 is in contact with each of the heater 62, the PT sensor 63, and the cooling liquid. Therefore, it is possible to check whether the PT sensor 63 breaks down and/or how accurate the PT sensor 63 is, by making the PT sensor 63 measure the temperature of the cooling liquid, because the temperature of the cooling liquid is constant and is equal to the temperature of the temperature control block 61.

Further, it is possible to detect whether there is a disconnection of the heater 62 and/or whether there is a failure in the heater circuit 42, by measuring and checking a difference between the temperature of the heater 62 without the application of electric currents and the temperature of the heater 62 to which a predetermined power is applied using the PT sensor 63. For example, if the temperature measured by the PT sensor 63 is higher than the temperature of the cooling liquid while the power is not applied to the heater 62, it can be detected that the OFF control of the power source 50 is not properly performed. Then, the heater circuit 42 can block the power supply from the power source 50.

On the other hand, when the heater 62 and the PT sensor 63 are in contact with the DUT, it is possible to check thermal contact resistance between the temperature control block 61 side and the DUT 32, by supplying a predetermined amount of power to the heater 62 and measuring a temperature change per unit time using the PT sensor 63. When the thermal contact resistance is higher, the PT sensor 63 detects smaller temperature change per unit time.

Further, in the embodiment, defect in the connector 33 or connecting lines between the device power source 21 and the DUT 32 can be detected. For example, a difference between each of source voltages F+, F−, and each of sense voltages S+, S− of the device power source 21 side is measured. Further, an electric current value is measured by the electric current measurement unit 23. When the measured values satisfy an expression:

(Source Voltage−Sense Voltage)/Electric Current Value>Predetermined Resistance, the connector 33 is judged to have a contact failure. When there is no difference between the source voltage and the sense voltage even though the electric current flows, the sense line between the DUT 32 and the device power source 21 is judged to be in a disconnected state. When the defective states as described above are detected, the test controller turns the device power source 21 off. Thus, heat generation and/or burning-out are prevented from being caused by the contact failure of the connector and the like at the burn-in test, during which a large electric current flows through the DUT.

The heater power control circuit and the burn-in apparatus using the circuit according to the present invention are useful for a burn-in apparatus which performs a burn-in test on semiconductor devices, and in particular, is suitable as means which allows reduction of noises transmitted from the heater when the temperature adjustment is performed using a heater.

The invention claimed is:

1. A heater power control circuit comprising:
a direct-current power source;
a heater;
a switching circuit that is connected to the direct-current power source and is configured to switch on/off a voltage supplied from the direct-current power source to control a power of the heater;
a voltage smoothing circuit that is disposed between the heater and the switching circuit and is configured to convert the voltage into an analog voltage signal by smoothing a voltage signal obtained by switching on/off the voltage;
a heater control circuit connected to the switching circuit to control switching of the switching circuit according to a voltage indicator signal; and
a voltage comparator circuit connected between the heater control circuit and the heater to compare a value of the voltage indicator signal with a value of the analog voltage signal;
wherein the heater control circuit is configured to control the power of the heater by controlling the switching on/off of the switching circuit based on a comparison result by the voltage comparator circuit, convert the voltage indicator signal into a time-dispersed voltage indicator signal which is obtained in a time-dispersed manner so that a variation of the voltage indicator signal per predetermined time becomes within a predetermined amount, and supply the time-dispersed voltage indicator signal to the switching circuit.

2. The heater power control circuit according to claim 1, wherein
the heater control circuit includes a table that stores a relationship between the voltage indicator signal and a series of time-dispersed voltage indicator signals corresponding to a variation of the voltage indicator signal, and the heater control circuit generates the time-dispersed voltage indicator signal by retrieving the table.

3. The heater power control circuit according to claim 1, wherein
the heater control circuit generates the time-dispersed voltage indicator signal based on a relational expression indicating a relationship between the voltage indicator signal and a series of time-dispersed voltage indicator signals corresponding to a variation of the voltage indicator signal.

4. The heater power control circuit according to claim 1, wherein
the heater control circuit generates the time-dispersed voltage indicator signal, the time-dispersed voltage indicator signal including pulses having a same pulse width and different time intervals.

5. The heater power control circuit according to claim 1, wherein
the heater control circuit uses a pulse width modulation signal as the time-dispersed voltage indicator signal.

6. The heater power control circuit according to claim 1, wherein
the switching circuit includes a current restricting circuit connected to the direct-current power source.

7. A burn-in apparatus, comprising:
a heater power control circuit to perform a burn-in test on a device under test, the heater power control circuit including:
a direct-current power source;
a heater;
a switching circuit that is connected to the direct-current power source and is configured to switch on/off a voltage supplied from the direct-current power source to control a power of the heater;
a voltage smoothing circuit that is disposed between the heater and the switching circuit and is configured to convert the voltage into an analog voltage signal by smoothing a voltage signal obtained by switching on/off the voltage;
a heater control circuit connected to the switching circuit to control switching of the switching circuit according to a voltage indicator signal; and
a voltage comparator circuit connected between the heater control circuit and the heater to compare a value of the voltage indicator signal with a value of the analog voltage signal;
wherein the heater control circuit is configured to control the power of the heater by controlling the switching on/off of the switching circuit based on a comparison result by the voltage comparator circuit, convert the voltage indicator signal into a time-dispersed voltage indicator signal which is obtained in a time-dispersed manner so that a variation of the voltage indicator signal per predetermined time becomes within a predetermined amount, and supply the time-dispersed voltage indicator signal to the switching circuit.

8. A method of controlling heater power, comprising:
switching on/off, by a switching circuit, a voltage signal supplied from a direct-current power source;
converting the voltage signal into an analog voltage signal by smoothing the voltage signal;
supplying the analog voltage signal to a heater to control a power of the heater;
controlling the switching on/off of the switching circuit according to a voltage indicator signal; and
comparing a value of the voltage indicator signal with a value of the analog voltage signal to output a comparison result;
wherein the power of the heater is controlled by controlling the switching on/off of the switching circuit based on the comparison result, the voltage indicator signal is converted into a time-dispersed voltage indicator signal which is obtained in a time-dispersed manner so that a variation of the voltage indicator signal per predetermined time is within a predetermined amount, and the time-dispersed voltage indicator signal is supplied to the switching circuit.

* * * * *